(12) United States Patent
Benhammadi

(10) Patent No.: US 12,306,714 B2
(45) Date of Patent: May 20, 2025

(54) DATA MEMORY EMULATION IN FLASH MEMORY

(71) Applicant: STMicroelectronics (Alps) SAS, Grenoble (FR)

(72) Inventor: Jawad Benhammadi, Pont de Claix (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 89 days.

(21) Appl. No.: 18/313,686

(22) Filed: May 8, 2023

(65) Prior Publication Data

US 2023/0385149 A1 Nov. 30, 2023

(30) Foreign Application Priority Data

May 25, 2022 (FR) ...................................... 2205050

(51) Int. Cl.
  *G06F 11/00* (2006.01)
  *G06F 11/10* (2006.01)
  *G06F 12/02* (2006.01)
  *G06F 13/16* (2006.01)

(52) U.S. Cl.
  CPC ...... *G06F 11/1068* (2013.01); *G06F 12/0246* (2013.01); *G06F 13/1668* (2013.01)

(58) Field of Classification Search
  CPC ............. G06F 11/1068; G06F 12/0246; G06F 11/0751
  See application file for complete search history.

(56) References Cited

U.S. PATENT DOCUMENTS

| | | | | |
|---|---|---|---|---|
| 6,851,013 B1 * | 2/2005 | Larsen | ................. | G11C 16/102 711/219 |
| 8,156,276 B2 * | 4/2012 | Morein | ............... | G06F 13/1684 710/305 |
| 8,443,263 B2 * | 5/2013 | Selinger | .............. | G06F 11/1068 714/768 |
| 9,059,745 B2 * | 6/2015 | Yuan | ..................... | H03M 13/27 |
| 10,250,390 B1 * | 4/2019 | Gray | ..................... | H04L 9/3239 |
| 11,567,831 B2 * | 1/2023 | Laurent | ............... | G06F 11/1076 |
| 11,650,945 B2 * | 5/2023 | Wu | ......................... | G06F 13/20 710/5 |
| 11,756,643 B2 * | 9/2023 | Jang | ....................... | G11C 29/42 365/185.09 |
| 2015/0039805 A1 | 2/2015 | Backhausen et al. | | |
| 2018/0314627 A1 | 11/2018 | Orme et al. | | |

* cited by examiner

*Primary Examiner* — Esaw T Abraham
(74) *Attorney, Agent, or Firm* — Slater Matsil, LLP

(57) ABSTRACT

In accordance with an embodiment, a method includes: performing a first write operation comprising writing a first data packet to a first portion of a first line of a flash memory; and performing a second write operation comprising writing a second data packet to a second portion of the first line of the flash memory, wherein the first line comprises the first data packet and the second data packet after performing the first write operation and the second write operation.

20 Claims, 5 Drawing Sheets

DATA MEMORY EMULATION IN FLASH MEMORY

CROSS-REFERENCE TO RELATED APPLICATIONS

This application claims the priority benefit of French Patent Application No. 2205050, filed on May 25, 2022, entitled "Data Memory Emulation in Flash memory", which is hereby incorporated by reference to the maximum extent allowable by law.

TECHNICAL FIELD

The present disclosure relates generally to the field of flash memories.

BACKGROUND

Programmable non-volatile memory, such as electrically erasable programmable read-only memory (EEPROM), allows certain data, such as configuration parameters, to be stored in electronic devices even when the electronic devices are powered down. However, in view of the technology used to implement an EEPROM, it cannot generally be integrated on-chip. External (off-chip) implementations of EEPROM lead to increased surface area, power consumption and cost.

Flash memory can be implemented on-chip. However, flash memory has certain access constraints. For example, unlike an EEPROM, it is not possible to overwrite individual data values in a flash memory. Therefore, there are technical problems in using an on-chip flash memory to implement memory storage similar to that offered by an EEPROM or other types of data memory.

SUMMARY

According to one aspect, there is provided a method of writing to a flash memory, the method comprising performing, by a controller of the flash memory: one or more first write operations to write a first data packet to a first portion of a first line of the flash memory; and one or more second write operations, after the one or more first write operations, to write a second data packet to a second portion of the first line of the flash memory such that the first line contains the first and second data packets.

According to another aspect, there is provided a flash memory comprising a controller configured to perform: one or more first write operations to write a first data packet to a first portion of a first line of the flash memory; and one or more second write operations, after the one or more first write operations, comprising writing a second data packet to a second portion of the first line of the flash memory such that the first line contains the first and second data packets.

According to one embodiment, the one or more first write operations further comprise writing a first error correction code, associated with the first data packet, to a third portion of the first line; and the one or more second write operations further comprise writing a second error correction code, associated with the second data packet, to a fourth portion of the first line.

According to one embodiment, the first data packet comprises a first data value and a first virtual address associated with the first data value, and the second data packet comprises a second data value and a second virtual address associated with the second data value, the second virtual address being different from, or the same as, the first virtual address.

According to one embodiment, the first and second virtual addresses are the same address.

According to one embodiment, the first data packet further comprises a first packet integrity verification code, and the second data packet further comprises a second packet integrity verification code.

According to one embodiment, the method further comprises one or more third write operations, before or after the one or more first write operations, comprising writing a code value to a first portion of a second line of the flash memory and writing a third error correction code to a second portion of the second line, a bit-length of the code value being equal to or greater than a combined bit-length of the first and second data packets.

According to one embodiment, the controller is further configured to perform one or more third write operations, before or after the one or more first write operations, comprising writing a code value to a first portion of a second line of the flash memory and writing a third error correction code to a second portion of the second line, wherein a bit-length of the code value is equal to or greater than a combined bit-length of the first and second data values.

According to one embodiment, the first line is part of a data storage zone of the flash memory, and the second line is part of a code storage zone of the flash memory, the flash memory further comprising at least one non-volatile register storing an indication of the lines of the flash memory forming part of the data storage zone, and the lines of the flash memory forming part of the code storage zone.

According to one embodiment, the first line is associated with both a first data storage address, and with a first code storage address different to the first data storage address; and the one or more first and second write operations comprise receiving by the controller the first data storage address, and mapping by the controller the first data storage address to a physical address of the first line of the flash memory.

According to one embodiment, the method further comprises, prior to the first write operation: receiving, by the controller of the flash memory, one or more first write commands associated with the one or more first write operations, the one or more first write commands comprising the first data packet and the first date storage address; and verifying, based on one or more parameters stored by the at least one non-volatile register, that the first line of the flash memory is configured to be part of the data storage zone.

According to yet a further aspect, there is provided a method comprising: writing first and second data packets to a flash memory according to the above method; and reading a current data value associated with the first virtual address from the flash memory by: identifying in the flash memory a most recently stored data packet comprising the first virtual address; transferring to a read buffer a data value of the identified data packet; and outputting the data value of the identified data packet as the current data value.

According to one embodiment, the controller is further configured to: identify in the flash memory a most recently stored data packet comprising the first virtual address; transfer to a read buffer a data value of the identified data packet; and output the data value of the identified data packet as the current data value.

According to one embodiment, outputting the data value of the identified data packet as the current data value is performed after a verification of an error correction code associated with the data value of the identified data packet.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Some embodiments of the present disclosure are directed to systems that emulate an EEPROM using a flash memory.

Figure 1:
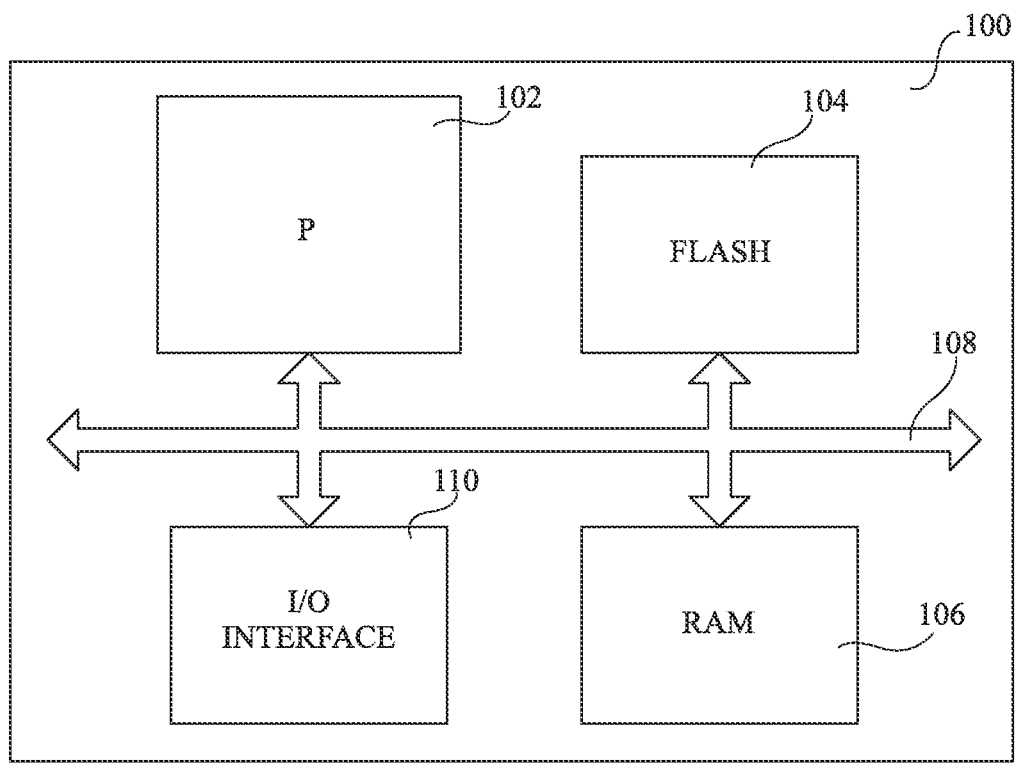
FIG. 1 schematically illustrates an electronic device comprising a flash memory configured to be used for emulation of a data memory according to an example embodiment of the present disclosure.

FIG. 1 schematically illustrates an electronic device 100 comprising a processing device 102 (P), a flash memory 104 (FLASH) and a volatile memory 106 (RAM), such as a random-access memory, interconnected by a bus 108. The processing device 102, for example, comprises one or more processors under control of instructions stored in the volatile memory 106. The electronic device 100 is for example an integrated circuit, or chip, and the FLASH memory 104 and volatile memory are for example integrated on-chip with the processing device 102. The electronic device 100 may comprise further components (not illustrated) coupled to the bus 108. In some embodiments, the device 100 also comprises an input/output interface 110 (I/O INTERFACE) coupled to the bus, allowing communications with off-chip devices such as an external memory device.

The flash memory 104 is configured to emulate, in at least a portion of its storage area, a data storage memory. For example, the emulated data storage memory has a finer access granularity than that of the FLASH memory. In the embodiments described in the present application, the emulated data storage memory is an EEPROM, although the principles described herein could be applied to the emulation, using a FLASH memory, of other types of data memories.

Figure 2:
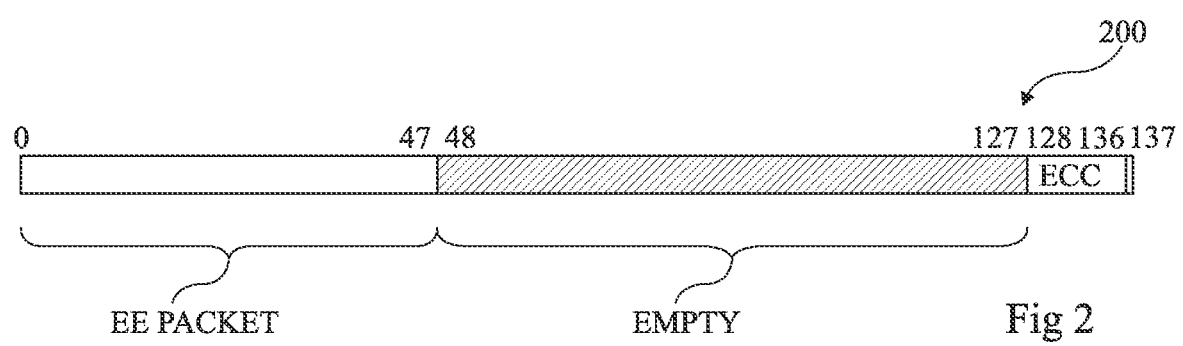
FIG. 2 illustrates a line of a flash memory storing an EEPROM packet according to a non-optimal approach.

FIG. 2 illustrates a line 200 of the flash memory 104 of FIG. 1 storing an EEPROM packet according to a non-optimal approach. In the example of FIG. 2, the flash line 200 is 138 bits long. For example, there are 128 bits of data/code storage (bits 0 to 127), corresponding to the bit-length granularity of a flash read or write access, and 9 bits of error correction code (ECC) (bits 128 to 136). The bit 137 is for example not used. In alternative embodiments, each flash line, and/or the data/code storage portion of each flash line, may have a different bit-length.

The access granularity of an EEPROM is generally lower than that of a flash memory, and according to one example shown in FIG. 2, each EEPROM data packet (EE PACKET) to be stored has a length of 48 bits, comprising 16 bits of data, 16 bits of address, and 16 bits of cyclic redundancy check (CRC), which is used to check the packet integrity. The address is, for example, a virtual address associated with the EEPROM data that serves as an identifier of the EEPROM data in the FLASH memory. When the data value associated with a given virtual address is to be modified, the modified data associated with the same virtual address is stored in a new flash memory location, which is for example a next free memory location in the flash memory. When a data value associated with a given virtual address is to be read from the flash memory, a search is made among the EEPROM data using read operations in order to find the latest, most up-to-date, data value associated with the virtual address.

In alternative embodiments, each EEPROM data packet could have a different length that is lower than the data length of a flash line. The EEPROM packet is for example protected by 9 bits of ECC, stored in the bits 128 to 136. Thus, 48 bits of the flash line are used, leaving an empty portion (EMPTY) of 80 bits, which in the example of FIG. 2 are the bits 48 to 127. Therefore, while the approach represented in FIG. 2 permits the access granularity of the flash to be respected, it leads to a lot of wasted space, meaning that a relatively large area of the flash memory is needed for a given size of EEPROM to be emulated. Furthermore, a difficulty is that flash memory cannot be overwritten line by line. Therefore, if the EEPROM packet is to be updated with a new data value, a new flash line should be used, adding to the complexity of the EEPROM emulation.

Figure 3:
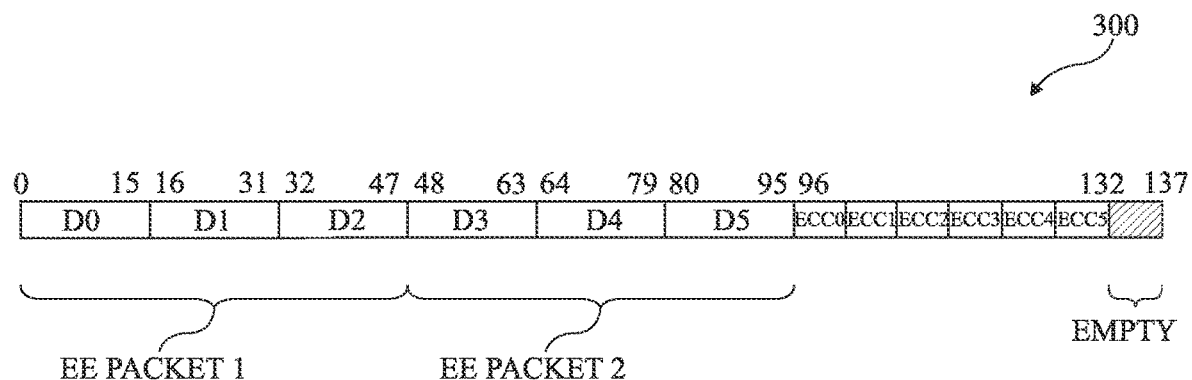
FIG. 3 illustrates a line of a flash memory storing EEPROM packets according to an example embodiment of the present disclosure.

FIG. 3 illustrates a line 300 of a flash memory storing EEPROM packets according to an example embodiment of the present disclosure. Like in the example of FIG. 2, the flash line of FIG. 3 is 138 bits in length.

In the example of FIG. 3, the flash line has data storage fields D0 to D5 for storing six corresponding data values each having a length of 16 bits, and six corresponding ECC fields for storing error correction codes ECC0 to ECC5 associated with the data values, each having a length of 6 bits. Thus, 96 bits (bits 0 to 95) are for example used for data storage, and 36 bits (bits 96 to 131) are for example used for storing the ECC values, leaving an empty portion (EMPTY) of just 6 bits (bits 132 to 137 in the example of FIG. 2).

In some embodiments, the data values D0, D1 and D2 store a first 48-bit EEPROM packet (EE PACKET 1), with 18 corresponding ECC bits ECC0, ECC1, ECC2, and the data values D3, D4 and D5 store a second 48-bit EEPROM packet (EE PACKET 2) with 18 corresponding ECC bits ECC3, ECC4, ECC5. Like in the example of FIG. 2, each EEPROM packet, for example, comprises a 16-bit data value, a 16-bit address, such as the virtual address associated with the EEPROM data, and a 16-bit CRC value, used to check the packet integrity. However, in alternative embodiments, it could comprise only a data value, or only a data value and an address, or only a data value and a CRC value, and the lengths of these values may be different from 16 bits.

While FIG. 3 illustrates an example in which two EEPROM packets are stored, depending on the length of each EERPOM packet and the length of the flash line, a different number of EEPROM packets could be stored in each flash line. For example, if each EEPROM packet has a bit length corresponding to only two of the six data fields (for example if it has a bit length of 32 bits), three EEPROM data packets could be stored in the data fields D0, D1, the data fields D2, D3 and the data fields D4, D5 respectively, or if each EEPROM packet has a bit-length corresponding to one of the six data fields (for example if it has a bit length of 16 bits), six EEPROM data packets could be stored in the data fields D0 to D5 respectively. Each flash line is, for example, configured to store at least two EEPROM packets, each in a corresponding portion of the flash line, and at least two corresponding ECC values, each in another corresponding portion of the flash line.

In some embodiments, the EEPROM packets stored in the same flash line 300 are different packets associated with different virtual addresses. Alternatively, the EEPROM packets stored in the same flash line 300 are different versions of the same packet associated with a same virtual address. For example, one of the EEPROM packets contains a first data value associated with a first virtual address, and a second of the EEPROM packets contains a second, updated data value associated with the same first virtual address. As will be described in more detail below, the latest EEPROM packet associated with a given virtual address is for example the packet stored most to the right in the flash line 300, and at a higher flash line address, although other arrangements would be possible.

Figure 4:
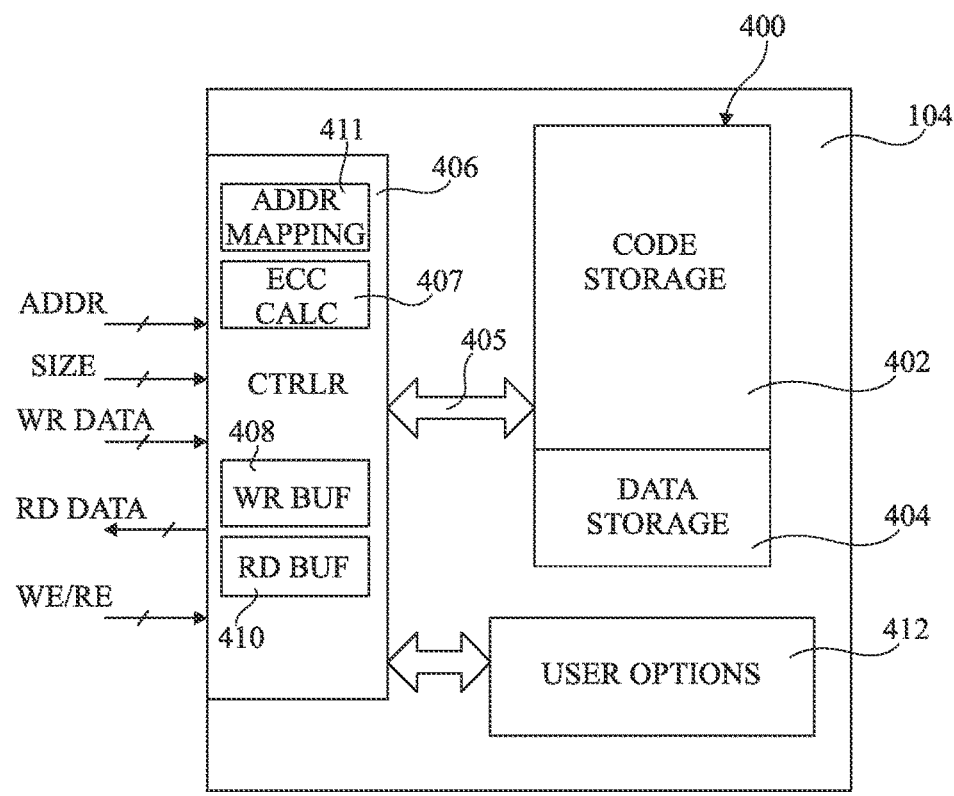
FIG. 4 schematically illustrates the flash memory of FIG. 1 in more detail according to an example embodiment of the present disclosure.

FIG. 4 schematically illustrates the flash memory 104 of the electronic device of FIG. 1 in more detail according to an example embodiment of the present disclosure.

The flash memory 104 for example comprises flash memory storage 400 formed of one or more flash memory arrays divided into a code storage zone 402 (CODE STORAGE) having flash lines configured to store code in a non-volatile fashion, and data storage zone 404 (DATA STORAGE) for example having flash lines configured to store data packets such as EEPROM packets. For example, each flash line of the code storage zone 402 is configured to store a single data value and a single ECC value.

In one example, the data value is of up to 128 bits in length, and the ECC value is of up to 9 bits in length, although alternative data and/or ECC lengths would be possible.

In contrast, each flash line of the data storage zone 404 is for example configured to be capable of storing a plurality of EEPROM packets, and a plurality of ECC values, according to the format described in relation with FIG. 3. Each EEPROM packet for example comprises a data value and a corresponding virtual address, and in some cases also a CRC value.

The flash memory 104 also for example comprises a controller 406 (CTRLR) coupled to the flash storage 400 via a bus 405, and configured to write data to the flash lines of the flash storage 400, and to read data from the flash lines of the flash storage 400 via the bus 405. The bus 405 for example has width equal to the size of a flash line. The flash controller 406 for example comprises an ECC calculation circuit 407 (ECC CALC), a write buffer 408 (WR BUF) capable of storing one or more flash lines to be written to the flash memory storage 400, and a read buffer 410 (RD BUF) capable of storing one or more flash lines read from the flash memory storage 400.

The flash controller 406 is for example coupled to the bus 108 of FIG. 1, and for example receives, via the bus 108, an address (ADDR) of a flash read or write access, a size value (SIZE) indicating a bit size of the access operation, which is for example 16 or 32 bits in the case of a data access, or 128 bits in the case of a code access, write data (WR DATA) to be written to the flash storage 400 during a flash write operation, and write and read enable signals (WE/RE). The flash controller 406 for example provides, to the bus 108, read data (RD DATA) that has been read from the flash memory storage 400. The write data bus WR DATA, and the read data bus RD DATA, each for example has a width equal to the access granularity of the code storage zone 402, equal for example to 128 bits, and when accesses are made to the data storage zone 404, only part of these buses are for example used.

The controller 406 also for example comprises an address mapping circuit (ADDR MAPPING) 411 capable of mapping addresses ADDR provided on the bus ADDR to physical addresses in the flash storage 400.

The flash memory 104 also for example comprises one or more non-volatile registers (USER OPTIONS) 412 capable of storing one or more flash parameters defining, for example, the range of flash lines forming the data storage zone 404, and/or the range of flash lines forming the code storage zone 402. For example, the one or more flash parameters comprise a parameter defining a boundary between the code storage zone 402 and the data storage zone 404. The registers 412 for example permit a user of the flash memory 104 to set, as user options, an amount of the flash memory storage area to be used for data storage, such as for EEPROM emulation.

The flash access granularity for example differs for accesses to the data storage zone 404 with respect to accesses to the code storage zone 402. For example, accesses to the code storage zone 402 are performed with a read and write granularity equal to the bit length of the storage portion of the flash lines, equal for example to 128 bits. In contrast, accesses to the data storage zone 404 are for example performed with read and write granularity lower than that of accesses to the code storage zone 402, and for example corresponding the size of the EERPROM packet or less, and for example equal to the size of one, two or three of the data fields D0 to D5.

Figure 5:
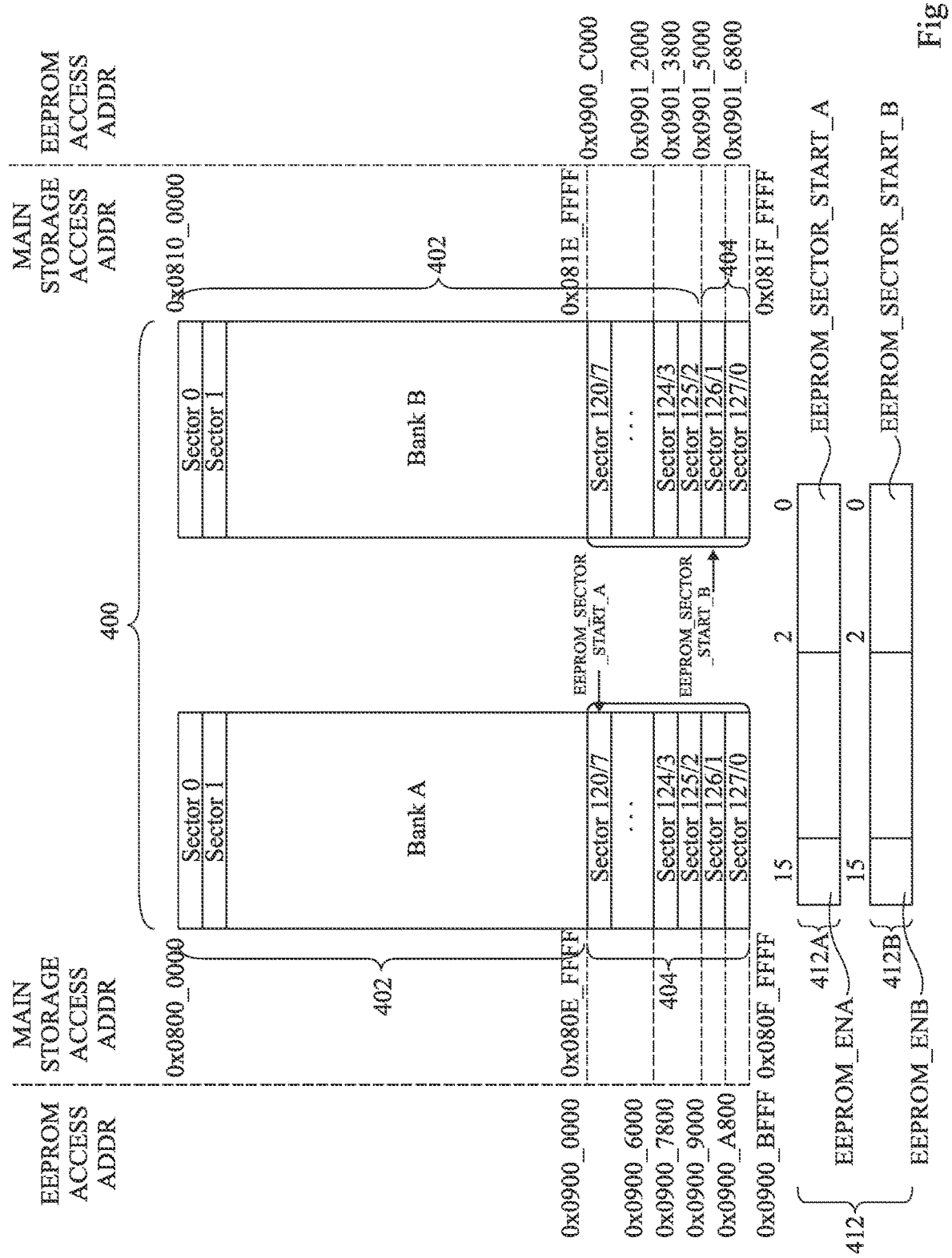
FIG. 5 schematically illustrates flash memory storage and registers of the flash memory of FIG. 4 in more detail according to an example embodiment of the present disclosure.

FIG. 5 schematically illustrates the flash storage 40o and registers 412 of the flash memory of FIG. 4 in more detail according to an example embodiment of the present disclosure.

In the example of FIG. 5, the flash storage is divided into two memory banks (Bank A, Bank B), each containing 128 sectors (Sector 0 to Sector 127). Of course, in alternative embodiments, the flash storage could comprise just one memory bank, or more than two memory banks. Each flash sector for example comprises a plurality of flash lines. In one example, each sector has a storage capacity of several thousand bytes.

In the bank A, a pointer EEPROM_SECTOR_START_A is for example used to indicate the start sector of the data storage zone 404. In the example of FIG. 5, this zone starts in sector 120, and occupies a final eight sectors 120 to 127 of the bank A.

Similarly, in the bank B, a pointer EEPROM_SECTOR_START_B is for example used to indicate the starting sector of the data storage zone 404. In the example of FIG. 5, this zone starts in sector 126, and occupies a final two sectors 126 and 127 of the bank B.

In some embodiments, the sectors of the code storage zone 402 have a first size, equal for example to around 8 kB, whereas the sectors of the data storage zone 404 have a second size that is smaller than the first size, equal for example to around 6 kB.

The pointers EEPROM_SECTOR_START_A and EEPROM_SECTOR_START_B are for example stored in corresponding registers 412A, 412B respectively of the registers 412. For example, the register 412A is a 16-bit register storing three bits (the bits 0 to 2 in the example of FIG. 5), indicating the start sector of the data storage zone 404 of bank A, which can for example be any of the last eight sectors numbered 127/0 to 120/7 in FIG. 5. For example, the binary value "000" designates the sector 127/0, and the binary value "111" designates the sector 120/7. The register 412A also for example stores a bit EEPROM_ENA, indicating whether the bank A includes a data storage zone 404, this bit being the bit 15 of the register 412A in the example of FIG. 5.

Similarly, the register 412B is for example a 16-bit register storing three bits (the bits 0 to 2 in the example of FIG. 5), indicating the start sector of the data storage zone 404 of bank B. The register 412B also for example stores a bit EEPROM_ENB, indicating whether the bank B includes a data storage zone 404, this bit being the bit 15 of the register 412B.

In some embodiments, the enable bits EEPROM_ENA and EEPROM_ENB are set by default to a value, for example a "0", that disables the data storage zones 404 of each bank, such that the entire banks are used for code storage, and the designation of the data storage zones is specifically programmed by writing to the registers 412.

In some embodiments, the addresses supplied on the bus 108 of FIG. 1 that are used to access the code storage zone 402 are different from the addresses supplied on the bus 108 that are used to access the data storage zone 404, and the controller 406 is for example configured to perform address mapping, using for example the address mapping circuit 411, from these addresses to the physical addresses of the flash sectors. In the example of FIG. 5, the addresses for accessing the sectors 0 to 127 of the code storage zone 402 are from 0x0800_0000 to 0x080F_FFFF for bank A, and from 0x0810_0000 to 0x081F_FFFF for bank B (addresses represented in hexadecimal), whereas the addresses for accessing the data storage zone 404 for sectors 120 to 127 are from 0x0900_0000 to 0x09100_BFFF for bank A, and from 0x0900_C000 to 0x0901_7FFF for bank B. Of course, these addresses are merely examples, and any address ranges that are different and non-overlapping could be used for accessing the code storage zone 402 and the data storage zone 404. An advantage of using different addresses is that this permits the controller 406 to detect when an access is intended to be made to the code storage zone 402 or to the data storage zone 404, and to verify, using the registers 412, that the corresponding portion of the flash memory is indeed configured as the intended storage type.

Figure 6:
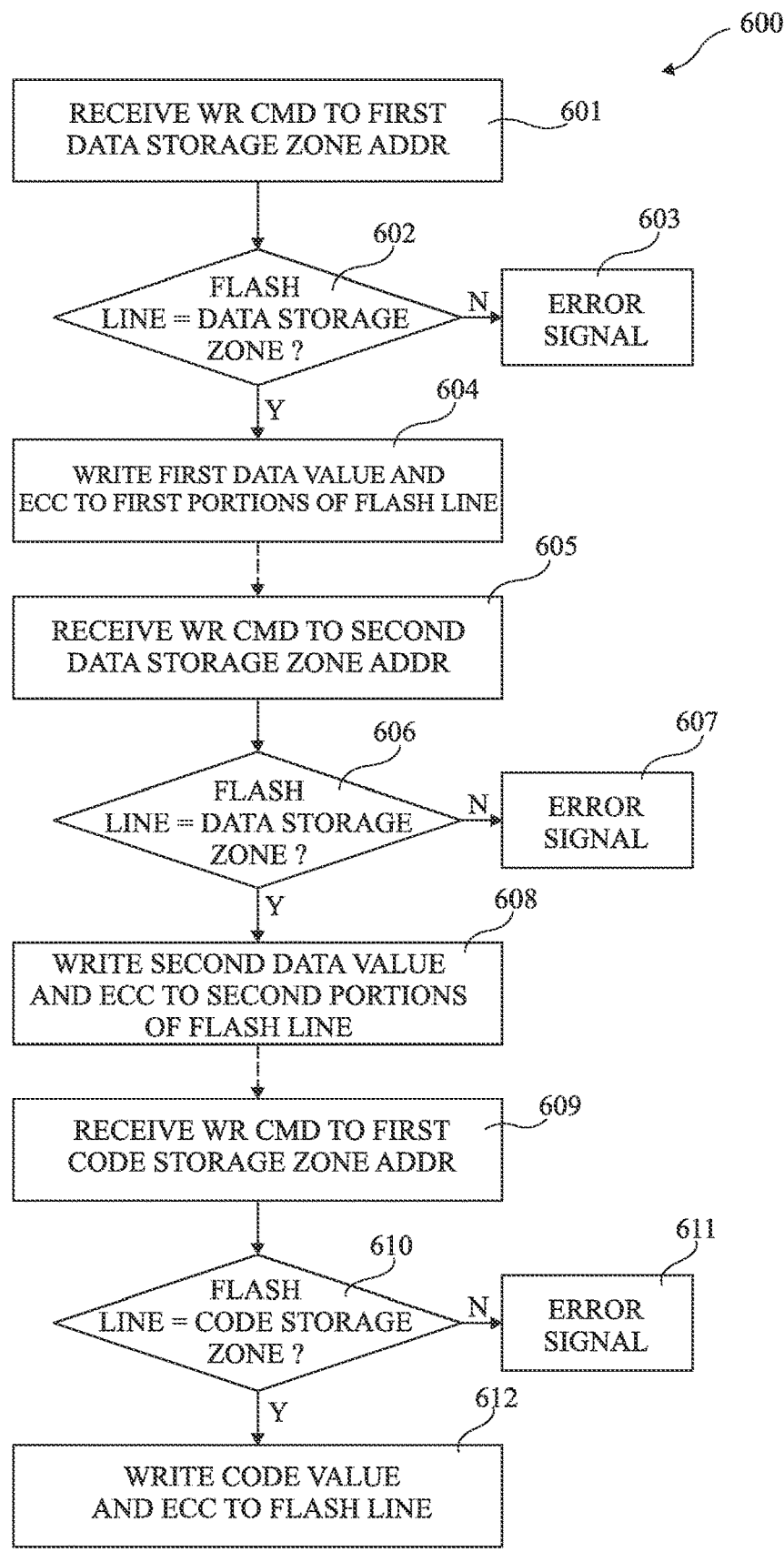
FIG. 6 is a flow diagram illustrating operations in a method of writing to a flash memory according to an example embodiment of the present disclosure.

FIG. 6 is a flow diagram illustrating operations in a method 600 of writing to a flash memory according to an example embodiment of the present disclosure. The operations of the method 60o are for example implemented by the controller 406 of the flash memory 104.

In an operation 601 (RECEIVE WR CMD TO FIRST DATA STORAGE ZONE ADDR), the controller 406 of the flash memory for example receives a write command directed to an address associated with the data storage zone 404. In some embodiments, the address of the write command designates a portion of a flash line within an address range dedicated to data storage zone 404, meaning that the controller 406 is able to deduce from the address that the intention is to write to the data storage zone 404. The address of the write command is provided on the input bus lines ADDR, and is for example accompanied by a size value on the input bus lines SIZE indicating a bit size of the data value to be written, which is for example of 16 or 32 bits. Furthermore, a first data value to be written is provided on the input bus lines WR DATA. The write enable signal WE is also for example asserted.

In an operation 602 (FLASH LINE=DATA STORAGE ZONE?), the controller 406 is for example configured to verify that the flash line corresponding to the address to be accessed is part of the data storage zone 404. For this, the controller 406 for example reads the registers 412, and verifies that that the flash line to be accessed is part of a sector designated as part of the data storage zone 404.

If the flash line is not in the data storage zone 404 (branch N from operation 602), in an operation 603 (ERROR SIGNAL), an error signal is for example transmitted by the controller 406 to the processing device 102, and/or to other circuitry, indicating that the write command cannot be satisfied, and the write operation is for example abandoned.

If the flash line is in the data storage zone 404 (branch Y from operation 602), in an operation 604 (WRITE FIRST DATA VALUE AND ECC TO FIRST PORTIONS OF FLASH LINE), a write operation is performed by the controller 406 to the portion of the flash line designated by the write address. This for example involves calculating an ECC value associated with the write data, and then storing the write data as a first data value in a portion of the flash line, and storing the calculated ECC value in another portion of the flash line. It is assumed that, prior to this write operation, all the bits of the flash line are in an unprogrammed state, which is for example a state corresponding to a logic "1".

In some embodiments, the write operation involves loading the write data and ECC value to the write register 408 of the controller 406. The write register 408 for example has the length of a flash line, and this operation for example involves masking in the write register 408 the bits of the flash line that are not to be modified. The controller 406 is for example configured to determine the physical address of the flash line containing the write address, and to read this flash line from the flash storage 400, and to store it in the write buffer 408. The controller 406 is then for example configured to write the first data value to the portion of the flash line identified by the write address. For example, the write address designates one or two of the data fields D0 to D5 of the flash line. The controller 406 for example stores, in the write buffer 408, the first data value to the data portion of the flash line designated by the write address, and the corresponding ECC value to the portion of the flash line associated with this data portion. For example, taking the example of the flash line 300 of FIG. 3, the first data value is for example stored to the data fields D0 and D1, and the ECC value is for example stored to the ECC fields ECC0 and ECC1. The contents of the write register 408 is then for example written to the corresponding flash line of the data storage zone 404, such that only the data fields D0 and D1, and the ECC fields ECC0 and ECC1, are modified, and the other bits of the flash line are left unmodified, and thus in the unprogrammed state. Of course, among the bits of the modified fields, only the bits that are to change state, for example from a logic "1" to logic "0", are actually modified.

In some embodiments, the first data value stored during the first write operation of operations 601 to 604 corresponds to a whole EEPROM packet. Alternatively, in the case that the size of the EEPROM packet is greater than the write granularity, one or more further write operations are for example performed by repeating the operations 601 to 604 in order to store the whole EEPROM packet.

Sometime after the first write operation implemented in operations 601 to 604, a further write operation of a second data value to the same flash line is for example performed, as represented by the operations 605 to 608. For example, the flash line is reserved for a given EEPROM packet, and the second write operation is made in order to store at least part of a second, updated data value of the EEPROM packet. It is not possible to overwrite the first data value in the flash line without first erasing the entire sector. Therefore, instead, the new data value and corresponding ECC are written to other unprogrammed portions of the flash line in operations 605 to 608. Alternatively, the second write operation is made in order to store an EEPROM packet associated with another virtual address. The operations 605 (RECEIVE WR CMD TO SECOND DATA STORAGE ZONE ADDR), 606 (FLASH LINE=DATA STORAGE ZONE?) and 607 (ERROR SIGNAL) are for example the same as the operations 601 to 603 described above, and will not be described again in detail. The operation 608 (WRITE SECOND DATA VALUE AND ECC TO SECOND PORTIONS OF FLASH LINE) is, however, different, as will now be described in more detail.

This second write operation to the flash line for example involves calculating an ECC value associated with the second write data, and then storing the write data as a second data value in the unprogrammed portion of the flash line, and storing the calculated ECC value in another unprogrammed portion of the flash line. In some embodiments, the write operation involves loading the new write data and ECC value to the write register 408 of the controller 406, while masking in the write register 408 the bits of the flash line that are not to be modified, which are the portions that have already been written and the portions that are not to be written. The controller 406 is for example configured to determine the physical address of the flash line containing the write address, and to read this flash line from the flash storage 400, and to store it in the write buffer 408. The controller 406 is then for example configured to write the second data value to the portion of the flash line identified by the write address. For example, the write address designates one or two of the data fields D0 to D5 of the flash line not already written in the first write operation. The controller 406, for example, stores, in the write buffer 408, the second data value to the data portion of the flash line designated by the write address, and the corresponding ECC value to the portion of the flash line associated with this data portion. Taking the example of the flash line 300 of FIG. 3, the second data value is for example stored to the data fields D3 and D4, and the ECC value is for example stored to the ECC fields ECC3 and ECC4. The contents of the write register 408 is then for example written to the corresponding flash line of the data storage zone 404, such that only the data fields D3 and D4, and the ECC fields ECC3 and ECC4, are modified, and the other bits of the flash line are left unmodified. Of course, among the bits of the modified fields, only the bits that are to change state, for example from a logic "1" to logic "0", are actually modified.

In some embodiments, the second data value stored during the second write operation of operations 605 to 608 corresponds to a whole EEPROM packet. Alternatively, in the case that the size of the EEPROM packet is greater than the write granularity, one or more further write operations are performed by repeating the operations 605 to 608 in order to store the whole EEPROM packet.

The method of FIG. 6 also includes a write operation to the code storage zone 402 of the flash memory, as represented by the operations 609 to 612. These operations are for example performed sometime after the second write operation of operations 6o5 to 608, but could alternatively be performed at any time before or after the first write operation. For example, these operations are performed as part of a software update.

In the operation 609 (RECEIVE WR CMD TO FIRST CODE STORAGE ZONE ADDR), the controller 406 of the flash memory for example receives a write command directed to an address associated with the code storage zone 402. In some embodiments, the address of the write command designates a flash line within an address range dedicated to the code storage zone 402, meaning that the controller 406 is able to deduce from the address that the intention is to write to the code storage zone 402. The address of the write command is provided on the input bus lines ADDR, and is for example accompanied by a corresponding data value on the input bus lines WR DATA, and the write enable signal WE is for example asserted.

In an operation 610 (FLASH LINE=CODE STORAGE ZONE?), the controller 406 is for example configured to verify that the flash line corresponding to the address to be accessed is part of the code storage zone 402. For this, the controller 406 for example reads the registers 412, and verifies that that the flash line to be accessed is not part of a sector designated as part of the data storage zone 404.

If the flash line is not in the code storage zone 402 (branch N from operation 610), in an operation 611 (ERROR SIGNAL), an error signal is for example transmitted by the controller 406 to the processing device 102, and/or to other circuitry, indicating that the write command cannot be satisfied, and the write operation is for example abandoned.

If the flash line is in the code storage zone 402 (branch Y from operation 610), in an operation 612 (WRITE CODE VALUE AND ECC TO FLASH LINE), a write operation is performed by the controller 406 to the flash line designated by the write address. This for example involves calculating an ECC value associated with the code value, and then storing the code value and the calculated ECC value to the flash line with a write granularity greater than that of a data write. For example, the write granularity is of 128 bits. It is assumed that, prior to this write operation, all the bits of the flash line are in an unprogrammed state, which is for example a state corresponding to a logic "1". In some embodiments, the write operation involves loading the write data and ECC value to the write register 408 of the controller 406. The contents of the write register 408 is then for example written to the corresponding flash line of the code storage zone 402.

While not illustrated in FIG. 6, in some embodiments, prior to writing to a portion of a flash line, a verification is made by the controller 406 that the portion is empty, for example that all of the bits are at an unprogrammed state, such as a logic "1". Indeed, in the case that the flash line portion already contains data, the data written to this portion will be corrupted, because it is not possible to write a "1" bit in memory cells already programmed with a "0" bit. Even if no verification is performed, the error will be detected during subsequent reading of the data because the ECC value will no longer be accurate.

A method of reading an EEPROM packet from the flash memory will now be described with reference to FIG. 7.

Figure 7:
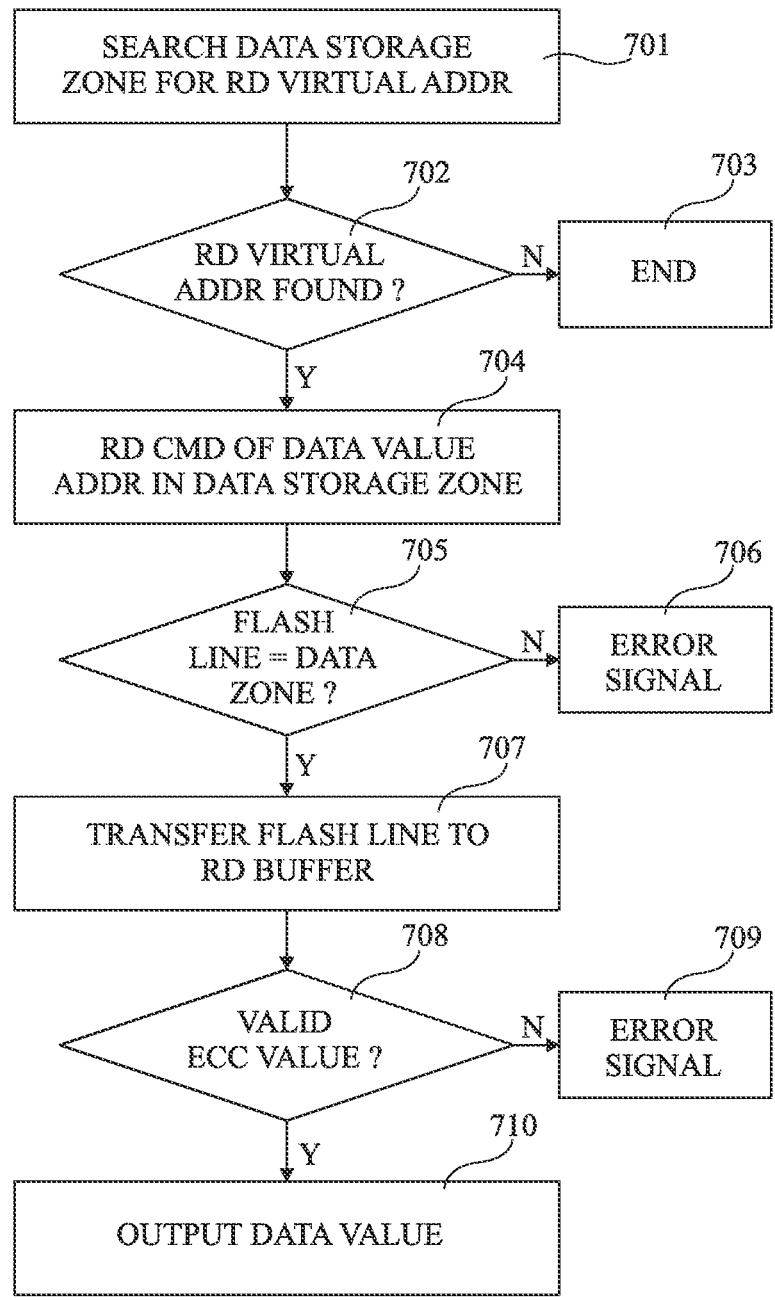
FIG. 7 is a flow diagram illustrating operations in a method of reading from a flash memory according to an example embodiment of the present disclosure.

FIG. 7 is a flow diagram illustrating operations in a method 700 of reading a current data value from a flash memory according to an example embodiment of the present disclosure. The operations of the method 700 are for example implemented by the processing device 102 of the device 100 of FIG. 1, and by the controller 406 of the flash memory 104. These operations are for example used to read a data value stored to the data storage zone 404 according to the method of FIG. 6. In particular, it is for example desired to read the current value of data associated with a given virtual address.

In an operation 701 (SEARCH DATA STORAGE ZONE FOR RD VIRTUAL ADDRESS), data memory emulation software executed by the processing device 102 for example initiates a search in the data storage zone 404 of the flash memory for an EEPROM packet associated with a virtual address of the data value to be read. More than one value of the data value associated with the read virtual address may have been stored to the data storage zone, and in order to identify the lasted, most up-to-date, value, a search is for example performed by reading the portions in the data storage zone 404 storing the virtual addresses, starting at the end of the data storage zone 404, and working backwards through the memory, and from the end towards the beginning of each flash line. For example, in each flash line, only two data portions, such as the data portions D0 and D3, store the virtual address associated with each EEPROM packet, and only these portions are read. Once there is a hit, meaning that the packet containing the read virtual address is located, or once the beginning of the data storage zone 404 is reached without any hit, an operation 702 is performed.

In the operation 702 (RD VIRTUAL ADDRESS FOUND?), it is determined whether the read virtual address has been found. If not (branch N), in an operation 703 (END), the read operation for example ends without finding any data value associated with the read virtual address. If a hit has been found in the memory (branch Y), an operation 704 is performed.

In the operation 704 (RD CMD OF DATA VALUE ADDR IN DATA STORAGE ZONE), the processing device 102 for example transmits a read command to the controller 406 of the flash memory to read a data portion corresponding to the EEPROM packet identified by the search. In some embodiments, the address of the read command designates a portion of a flash line within an address range dedicated to the data storage zone 404, meaning that the controller 406 is able to deduce from the address that the intention is to read from the data storage zone 404. The address of the read command is provided on the input bus lines ADDR, a size value, designating for example a read bit-size of 16 or 32 bits, is for example provided on the input bus lines SIZE, and the read enable signal RE is for example asserted.

In an operation 705 (FLASH LINE=DATA STORAGE ZONE?), the controller 406 is for example configured to verify that the flash line corresponding to the read address to be accessed is part of the data storage zone 404. For this, the controller 406 for example reads the registers 412, and verifies that the flash line to be accessed is part of a sector designated as part of the data storage zone 404.

If the flash line is not in the data storage zone 404 (branch N from operation 705), in an operation 706 (ERROR SIGNAL), an error signal is for example transmitted by the controller 406 to the processing device 102, and/or to other circuitry, indicating that the read command cannot be satisfied, and the read operation is for example abandoned.

If the flash line is in the data storage zone 404 (branch Y from operation 705), in an operation 707 (TRANSFER FLASH LINE TO RD BUFFER), the flash line comprising the data value designated by the read data value address is for example transferred to the read buffer 410.

In an operation 708 (VALID ECC VALUE?), the ECC value associated with the read data value address is for example verified.

If the ECC value is not valid (branch N from operation 708), in an operation 709 (ERROR SIGNAL), an error signal is for example transmitted by the controller 406 to the processing device 102, and/or to other circuitry, indicating that the data has been corrupted, and the read operation is for example abandoned.

If the ECC value is valid (branch Y from operation 708) in an operation 710, the data value in the flash line designated by the read data value address is for example provided on the output bus lines RD DATA of the controller 406, and the data value is thus provided to the processing device 102. If the data value of the EEPROM packet associated with the virtual address has a greater bit length than the read granularity of the data storage zone 404, the operations 704 to 710 are for example repeated for other bits of the data value until the whole data value has been read.

An advantage of the embodiments described herein is that an EEPROM, or other type of non-volatile data memory, can be emulated in a zone of a flash memory with relatively little wasted memory area. Indeed, by permitting a write granularity of less than half a flash line, it is possible to store two or more data values to the flash line at different times.

Various embodiments and variants have been described. Those skilled in the art will understand that certain features of these embodiments can be combined and other variants will readily occur to those skilled in the art. For example, it will be apparent to those skilled in the art that, while embodiments have been described in which the same physical address space of the flash memory is accessed using different addresses depending on whether the data storage zone, or the code storage zone, is being accessed, it would be possible in alternative embodiments to use the same addresses for accessing the flash memory irrespective of whether or not the zone is defined as a data storage zone.

Finally, the practical implementation of the embodiments and variants described herein is within the capabilities of those skilled in the aft based on the functional description provided hereinabove.

What is claimed is:
1. A method comprising:
performing a first write operation comprising writing a first data packet to a first portion of a first line of a flash memory, wherein the first line of the flash memory comprises a first number of memory cells; and performing a second write operation comprising writing a second data packet to a second portion of the first line of the flash memory, wherein the first line comprises the first data packet and the second data packet after performing the first write operation and the second write operation, wherein the first portion and the second portion of the first line of the flash memory together comprise a second number of the memory cells less than the first number of memory cells, the first portion and the second portion of the first line of the flash memory together have an access granularity of at least the second number, and the second portion of the first line of the flash memory is in an unprogrammed state prior to performing the second write operation.

2. The method of claim 1, wherein:
performing the first write operation further comprises writing a first error correction code associated with the first data packet to a third portion of the first line of the flash memory; and
performing the second write operation further comprises writing a second error correction code associated with the second data packet to a fourth portion of the first line of the flash memory.

3. The method of claim 1, wherein:
the first data packet comprises a first data value and a first virtual address associated with the first data value; and
the second data packet comprises a second data value and a second virtual address associated with the second data value.

4. The method of claim 3, wherein the first virtual address is different from the second virtual address.

5. The method of claim 3, wherein the first virtual address is the same as the second virtual address.

6. The method of claim 3, wherein:
the first data packet further comprises a first packet integrity verification code; and
the second data packet further comprises a second packet integrity verification code.

7. The method of claim 3, further comprising reading a current data value associated with the first virtual address from the flash memory, reading comprising:
identifying a most recently stored data packet comprising the first virtual address in the flash memory; and
outputting a data value of the identified data packet as the current data value.

8. The method of claim 7, further comprising verifying an error correction code associated with the data value of the identified data packet before outputting the data value.

9. The method of claim 1, further including performing a third write operation comprising:
writing a code value to a first portion of a second line of the flash memory, wherein the second line of the flash memory comprises a same number of memory cells as the first line of the flash memory; and
writing a third error correction code to a second portion of the second line, wherein a bit-length of the code value is equal to or greater than a combined bit-length of the first and second data packets.

10. A system comprising:
a flash memory controller configured to be coupled to a flash memory having a first line of flash memory comprising a first number of memory cells, wherein the flash memory controller is configured to:
perform a first write operation comprising writing a first data packet to a first portion of the first line of the flash memory; and
perform a second write operation comprising writing a second data packet to a second portion of the first line of the flash memory, wherein the first line comprises the first data packet and the second data packet after performing the first write operation and the second write operation, wherein the first portion and the second portion of the first line of the flash memory together comprise a second number of the memory cells less than the first number of memory cells, the first portion and the second portion of the first line of the flash memory together have an access granularity of at least the second number, and the second portion of the first line of the flash memory is in an unprogrammed state prior to performing the second write operation.

11. The system of claim 10, wherein:
performing the first write operation further comprises writing a first error correction code associated with the first data packet to a third portion of the first line of the flash memory; and
performing the second write operation further comprises writing a second error correction code associated with the second data packet to a fourth portion of the first line of the flash memory.

12. The system of claim 10, wherein:
the first data packet comprises a first data value and a first virtual address associated with the first data value; and
the second data packet comprises a second data value and a second virtual address associated with the second data value.

13. The system of claim 12, further comprising a read buffer configured to be coupled to the flash memory, wherein the flash memory controller is further configured to read a current data value associated with the first virtual address from the flash memory by:
identifying a most recently stored data packet comprising the first virtual address in the flash memory;
transferring a data value of the identified data packet to the read buffer; and
outputting the data value of the identified data packet as the current data value.

14. The system of claim 13, wherein the flash memory controller is further configured to verify an error correction code associated with the data value of the identified data packet before outputting the data value.

15. The system of claim 10, wherein the flash memory controller is further configured to perform a third write operation comprising:
writing a code value to a first portion of a second line of the flash memory, wherein the second line of the flash memory comprises a same number of memory cells as the first line of the flash memory; and
writing a third error correction code to a second portion of the second line, wherein a bit-length of the code value is equal to or greater than a combined bit-length of the first and second data packets.

16. The system of claim 15, wherein:
the first line is a part of a data storage zone of the flash memory;
the second line is a part of a code storage zone of the flash memory; and
the system further comprises at least one non-volatile register configured to store at least one value indicating which lines of the flash memory form at least a portion of the data storage zone and indicating which lines of the flash memory form at least a portion of the code storage zone.

17. The system of claim 16, wherein:
the first line is associated with both a first data storage address, and a first code storage address different from the first data storage address; and
the first write operation and the second write operation each further comprises:
receiving, by the flash memory controller, the first data storage address, and
mapping, by the flash memory controller, the first data storage address to a physical address of the first line of the flash memory.

18. The system of claim 17, wherein the flash memory controller is further configured to:
receive a first write command associated with the first write operation, wherein the first write command comprises the first data packet and the first data storage address; and
verify, based on one or more parameters stored in the at least one non-volatile register, that the first line of the flash memory is configured to be a part of the data storage zone.

19. The system of claim 10, further comprising the flash memory.

20. A method of reading flash memory comprising a first data packet including a first data value and a first virtual address written to a first portion of a first line of the flash memory, a second data packet including a second data value and a second virtual address written to a second portion of the first line of the flash memory, wherein the first line of the flash memory comprises memory cells, the method comprising:
identifying a most recently stored data packet comprising the first virtual address in the flash memory; and
outputting a data value of the identified data packet as a current data value.

* * * * *